(12) United States Patent
Agarwal et al.

(10) Patent No.: US 8,980,760 B2
(45) Date of Patent: Mar. 17, 2015

(54) METHODS AND APPARATUS FOR CONTROLLING PLASMA IN A PROCESS CHAMBER

(75) Inventors: Ankur Agarwal, Mountain View, CA (US); Ajit Balakrishna, Sunnyvale, CA (US); Shahid Rauf, Pleasanton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 177 days.

(21) Appl. No.: 13/442,478

(22) Filed: Apr. 9, 2012

(65) Prior Publication Data

US 2012/0273341 A1   Nov. 1, 2012

Related U.S. Application Data

(60) Provisional application No. 61/480,566, filed on Apr. 29, 2011.

(51) Int. Cl.
*H01L 21/302* (2006.01)
*H05H 1/46* (2006.01)
*H01J 37/32* (2006.01)

(52) U.S. Cl.
CPC ............ *H05H 1/46* (2013.01); *H01J 37/32082* (2013.01); *H01J 37/32137* (2013.01); *H01J 37/32165* (2013.01); *H05H 2001/4682* (2013.01)
USPC ............ 438/714; 438/710; 438/729; 216/67; 156/345.48

(58) Field of Classification Search
CPC .............. H01J 37/32091; H01J 37/321; H01J 37/3211; H01L 21/31138; H01L 21/31116; H01L 21/3065
USPC ........... 438/706, 710, 712, 714, 720, 10, 727, 438/729; 156/345.44, 345.47, 345.48; 216/67, 68
See application file for complete search history.

(56) References Cited

U.S. PATENT DOCUMENTS

| | | | |
|---|---|---|---|
| 2002/0026251 A1* | 2/2002 | Johnson et al. | 700/67 |
| 2004/0124177 A1* | 7/2004 | Urban et al. | 216/67 |
| 2008/0053818 A1* | 3/2008 | Ui | 204/164 |
| 2010/0130018 A1* | 5/2010 | Tokashiki et al. | 438/710 |
| 2011/0031216 A1 | 2/2011 | Liao et al. | |
| 2011/0097901 A1 | 4/2011 | Banna et al. | |

* cited by examiner

*Primary Examiner* — Lan Vinh
(74) *Attorney, Agent, or Firm* — Moser Taboada; Alan Taboada

(57) ABSTRACT

Methods and apparatus for controlling a plasma are provided herein. In some embodiments, a method may include supplying a first RF signal having a first frequency and a first period from an RF power source to a first electrode, wherein the first period is a first integer number of first cycles at the first frequency; supplying a second RF signal having a second frequency and a second period from the RF power source to the first electrode, wherein the second period is a second integer number of second cycles at the second frequency and wherein a first multiplicative product of the first frequency and the first integer number is equal to a second multiplicative product of the second frequency and the second integer number; and controlling the phase between the first and second periods to control an ion energy distribution of the plasma formed in a process chamber.

20 Claims, 6 Drawing Sheets

METHODS AND APPARATUS FOR CONTROLLING PLASMA IN A PROCESS CHAMBER

CROSS-REFERENCE TO RELATED APPLICATIONS

This application claims benefit of U.S. provisional patent application Ser. No. 61/480,566, filed Apr. 29, 2012, which is herein incorporated by reference.

FIELD

Embodiments of the present invention generally relate to methods and apparatus for controlling a plasma in a process chamber.

BACKGROUND

Control of an ion energy distribution (IED) in a plasma is sometimes used to control substrate processes, such as selective etch processes or other suitable plasma processes. Control of the ion energy distribution in a plasma has been achieved by varying the amplitude or frequency of an applied radio frequency (RF) signal to control the width and average energy of the IED. For example, increasing the frequency of the RF signal can be used to decrease the width of the IED. However, the inventors have discovered that the wavelength at high frequency may become comparable to critical dimensions of features on the substrate which can result in process non-uniformities. Further, high frequency RF signals may not be compatible with components of a process chamber, such as an electrostatic chuck, which may be part of a substrate support.

Accordingly, the inventors have provided improved methods and apparatus for controlling the ion energy distribution of a plasma.

SUMMARY

Methods and apparatus for controlling a plasma in a process chamber are provided herein. In some embodiments, a method of controlling a plasma in a process chamber may include supplying a first RF signal having a first frequency and a first period from an RF power source to a first electrode disposed beneath a substrate support surface in the process chamber, wherein the first period is equal to a first integer number of first cycles at the first frequency; supplying a second RF signal having a second frequency and a second period from the RF power source to the first electrode, wherein the second period is equal to a second integer number of second cycles at the second frequency and wherein a first multiplicative product of the first frequency and the first integer number is equal to a second multiplicative product of the second frequency and the second integer number; and controlling the phase between the first and second periods of the first and second RF signals to control a ion energy distribution of a plasma formed in the process chamber.

In some embodiments, a method of controlling characteristics of a plasma in a process chamber using an RF power source may include determining a desired ion energy distribution for the plasma; and controlling the phase between a first period of a first and a second period of a second RF signal applied to a first electrode disposed beneath a substrate support surface in the process chamber to produce the desired ion energy distribution, wherein the first RF signal has a first frequency and the first period is equal to a first integer number of first cycles at the first frequency and wherein the second RF signal has a second frequency and the second period is equal to a second integer number of second cycles at the second frequency, and wherein a first multiplicative product of the first frequency and the first integer number is equal to a second multiplicative product of the second frequency and the second integer number.

In some embodiments, an apparatus to process a substrate may include a process chamber having a substrate support disposed in a processing volume of the process chamber; a first electrode disposed beneath a substrate support surface of the substrate support; a first RF power source coupled to the first electrode to provide a first RF signal having a first frequency and a first period and a second RF signal having a second frequency and a second period to the first electrode, wherein the first period is equal to a first integer number of first cycles at the first frequency, wherein the second period is equal to a second integer number of second cycles at the second frequency, and wherein a first multiplicative product of the first frequency and the first integer number is equal to a second multiplicative product of the second frequency and the second integer number; and a phase controller to tune the phase between the first and second periods of the first and second RF signals. The control of the phase between the first and second periods of the first and second RF signals can control an ion energy distribution of a plasma formed in the process chamber.

Other and further embodiments of the present invention are described below.

BRIEF DESCRIPTION OF THE DRAWINGS

Embodiments of the present invention, briefly summarized above and discussed in greater detail below, can be understood by reference to the illustrative embodiments of the invention depicted in the appended drawings. It is to be noted, however, that the appended drawings illustrate only typical embodiments of this invention and are therefore not to be considered limiting of its scope, for the invention may admit to other equally effective embodiments.

Figure 1:
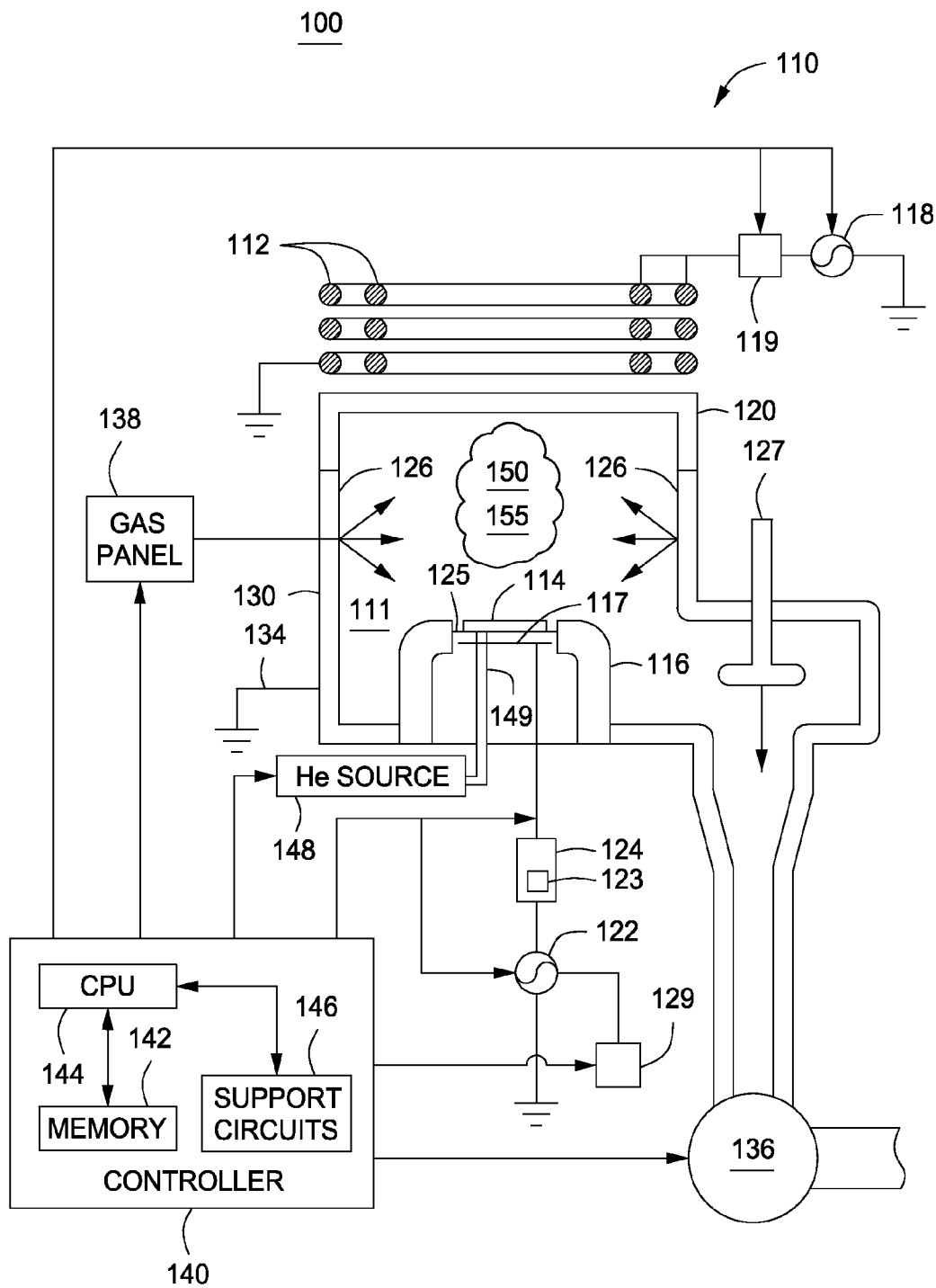
FIG. 1 depicts a schematic view of a processing system in accordance with some embodiments of the present invention.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Methods and apparatus for controlling a plasma in a process chamber are provided herein. Embodiments of the inventive methods can advantageously provide control over the ion flux at various energies in an ion energy distribution (IED) of the plasma while the total ion flux may be conserved. For example, in at least some embodiments, the inventive methods may allow for selection of a maximum flux at a desired energy or range of energies while maintaining a constant total ion flux in the IED. Other advantages and embodiments of the inventive methods and apparatus for controlling a plasma in a process chamber are discussed below. For example, the inventors have observed that control of the ion energy distribution can advantageously facilitate highly selective etching on a substrate, although benefits in other applications are apparent as well.

FIG. 1 depicts a schematic view of a processing system in accordance with some embodiments of the present invention. For example, the processing system maybe be an etch reactor 100 as illustrated in FIG. 1. The etch reactor 100 may be utilized alone or, more typically, as a processing module of an integrated semiconductor substrate processing system, or cluster tool, such as a CENTURA® integrated semiconductor substrate processing system, available from Applied Materials, Inc. of Santa Clara, Calif. Examples of suitable etch reactors 100 include the ADVANTEDGE™ line of etch reactors (such as the AdvantEdge G3 or the AdvantEdge G5), the DPS® line of etch reactors (such as the DPS®, DPS® II, DPS® AE, DPS® HT, DPS® G3 poly etcher), or other etch reactors, and non-etching plasma enhanced process chambers, also available from Applied Materials, Inc. Other plasma enhanced process chambers, including those from other manufacturers, may suitably benefit from the present invention as described herein.

The etch reactor 100 comprises a chamber 110 having a substrate support 116 disposed in a processing volume 111 within a conductive body (wall) 130, and a controller 140. The substrate support 116 may include a first electrode 117 disposed beneath a substrate support surface 125 of the substrate support 116. The first electrode may be coupled through a first matching network 124, to a biasing power source 122 (e.g., a first RF power source). The biasing power source 122 generally may be capable of producing up to 1500 W at a frequencies ranging from 0.4 to about 60 MHz. The biasing power may be either continuous or pulsed power. The biasing power source 122 may be operable in a continuous wave (CW) or pulsed mode. The biasing power source 122 may be operated at a duty cycle (e.g., the percentage of on time during the total of on time and off time in a given cycle) of between about 10% and about 90%.

The first RF power source (e.g., the biasing power source 122) may provide one or more RF signals to the first electrode 117. For example, the first RF power source may provide a first RF signal and a second RF signal to the first electrode 117. In some embodiments, the first RF signal and the second RF signal may have frequencies that are integer multiples. For example, the second RF signal may be at a second frequency that is a harmonic frequency of a first frequency of the first RF signal. In some embodiments, the first RF power source may have an output that is coupled to a frequency multiplier to control the frequency of an RF signal produced by the first RF power source. For example, the first matching network 124 may include a frequency multiplier 123 to produce the second frequency of the second RF signal at a harmonic frequency of the first frequency of the first RF signal.

The system may include a phase controller 129 coupled to the first RF power source to tune the phase between RF signals provided by the first RF power source to the first electrode 117. For example, the phase controller 129 may be used to tune, or control, the relative phase between the first RF signal and the second RF signal provided by the first RF power source. For example, as discussed in the methods 300 and 500 below, tuning the phase between RF signals, such as the first and second RF signals, may be used to control an ion energy distribution in a plasma (e.g., a plasma 155) formed in the chamber 110. For example, the phase controller 129 may be configured to tune the phase between the first and second RF signals to produce an amount of ions in the ion energy distribution of the plasma having a desired energy. For example, the phase controller 129 may be configured to tune the phase between the first and second RF signals to control a range of ion energies in the ion energy distribution of the plasma. Alternatively (not shown), the phase controller 129 may be an element of the controller 140, or the controller 140 may provide the functionality of the phase controller 129 to control the phase of RF signals produced by the first RF power source. Additional embodiments of a phase controller, such as a phase shifter 207 are illustrated in FIGS. 2C-D and discussed below.

Figure 2A:
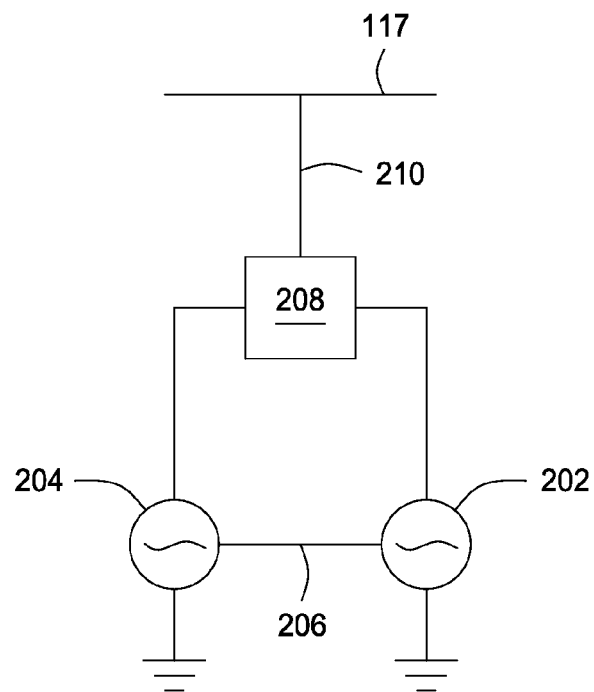
FIGS. 2A-D depict alternative embodiments of RF biasing components that may be used in the processing system depicted in FIG. 1.
Figure 2B:
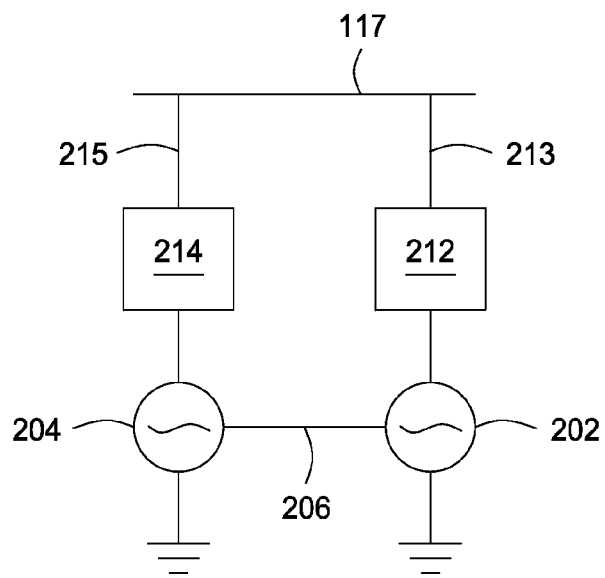

Alternative embodiments of RF biasing components that may be used in the chamber 110 are illustrated in FIGS. 2A-D. The chamber 110 and other system components have been omitted from FIGS. 2A-D. In some embodiments, the first RF power source may be a single RF generator, such as the biasing power source 122 depicted in FIG. 1. In some embodiments, the first RF power source may be a plurality of RF generators, such as depicted in FIGS. 2A-B. For example, as illustrated in FIG. 2A, the first RF power source may include a plurality of RF generators, such as a first RF generator 202 to provide the first RF signal and a second RF generator 204 to provide the second RF signal. The first and second RF generators may be coupled by a link 206 to facilitate synchronizing the operation of one generator to the other. Either RF generator may be the lead, or master, RF generator, while the other RF generator follows, or is the slave. The link 206 may further facilitate operating the first and second RF generators 202, 204 in perfect synchronization, or in a desired offset, or phase difference. For example, the link 206 may serve as a phase controller to tune the phase difference between the first and second RF signals of the RF generators 202, 204. The first and second RF generators 202, 204 may be coupled to the first electrode 117 via a dual matching network 208 having a single feed 210 to the first electrode 117. The dual matching network 208 may include a frequency multiplier (not shown) to alter the frequency of either the first or second RF generators 202, 204 to produce a harmonic frequency. Alternatively, the first and second generators 202, 204 may each produce a different frequency or range of frequencies, where the frequency or range of frequencies produced by one of the RF generators 202 or 204 is a harmonic of the frequency or range of frequencies produced by the other.

Alternatively, as illustrated in FIG. 2B, each RF generator 202, 204 may be coupled to the first electrode 117 via a separate matching network 212, 214. For example, the first RF generator 202 may be coupled to the first electrode 117 via a feed 213 from the matching network 212 and the second generator 204 may be coupled to the first electrode 117 via a feed 215 from the matching network 214. Similar to the embodiments of FIG. 2A, one of the matching networks 212, 214 may include a frequency multiplier to produce a harmonic frequency, or alternatively, each of the RF generators 202, 204 may be set at different frequencies or ranges of frequencies that are integer multiples, such as harmonic frequencies.

Figure 2C:
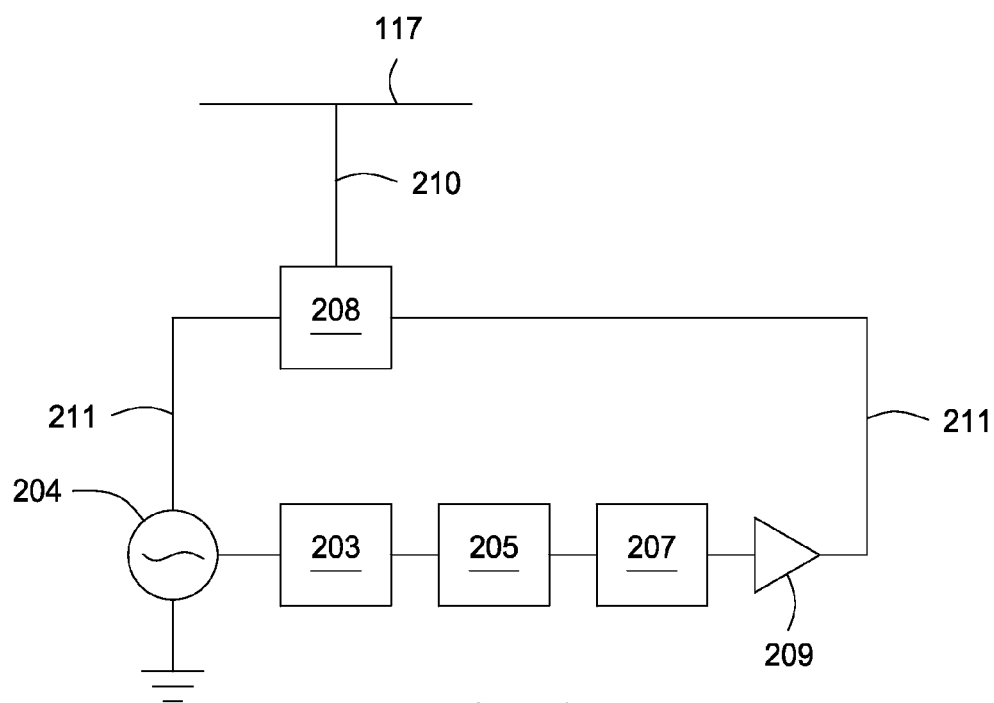
Figure 2D:
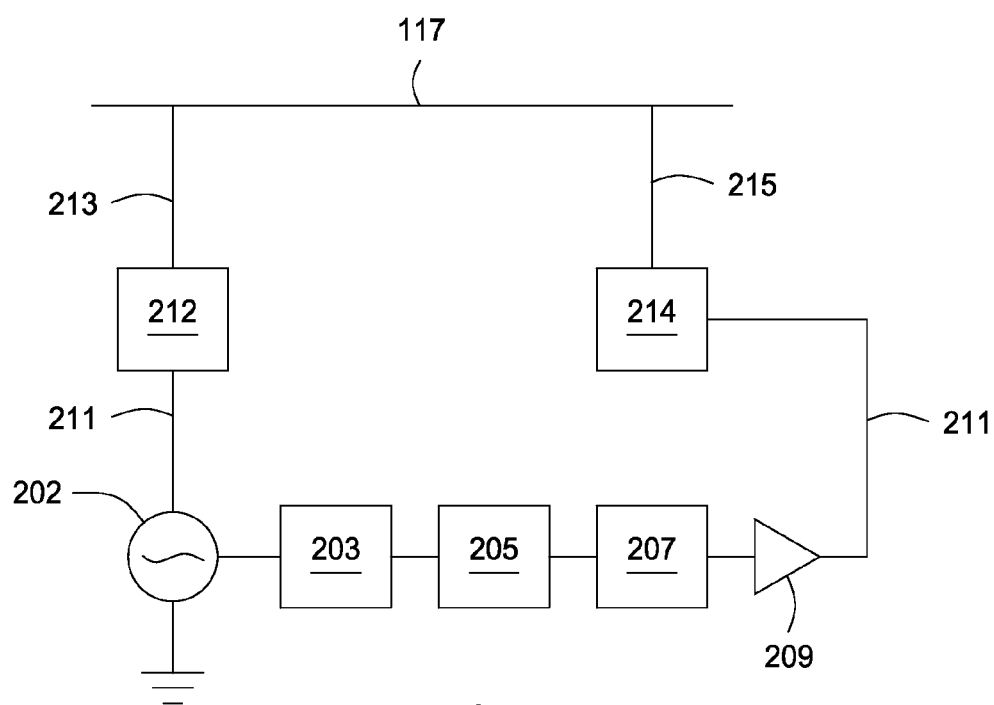

Alternatively, as illustrated in FIGS. 2C-D a single generator may be used with either a single matching network (FIG. 2C) or separate matching networks 212, 214. For example, as illustrated in FIGS. 2C-D, the first RF generator 202 may provide both the first RF signal and the second RF signal to the first electrode 117.

For example, as illustrated in FIG. 2C, the first RF generator 202 may be coupled to the matching network 208 via a first feed 201 and a second feed 211. As shown, the first feed 201 may couple directly to the matching network 208. The first feed 201 may provide the first RF signal which may be at a frequency or range of frequencies generated by the first RF generator 202. The second feed 201 may provide the second RF signal, which may be a harmonic of the first RF signal, by manipulating the frequency or range of frequencies generated by the first RF generator 202. For example, the second feed may include a non-linear circuit element 203 (e.g., a frequency multiplier) to generate one or more harmonic frequencies from the frequency or range of frequencies provided by the first RF generator 202. A band-pass filter 205 may be used to filter a desired harmonic frequency from the one or more harmonic frequencies generated by the non-linear circuit 203. A phase shifter 207 (e.g., a phase controller) may be used to adjust the phase of the second RF signal relative to the phase of the first RF signal after the desired harmonic frequency has been selected by the band-pass filter 205. The phase shifter 207 may be analog or digital. For example, the phase shifter 207 may include an LC circuit or all-pass filter, or may be an op-amp based phase shifter. Optional, to increase the strength of the second RF signal, an amplifier 209 may be used after the phase shifter 207.

Alternative to the embodiments of FIG. 2C, the first RF generator 202 may have the first feed 201 coupled to the matching network 212 to provide the first RF signal to the electrode 117 via the feed 213 and the second feed 211 coupled to the matching network 214 to provide the second RF signal to the electrode via the feed 215.

Returning to FIG. 1, the chamber 110 may be supplied with a substantially flat dielectric ceiling 120. Alternatively, the chamber 110 may have other types of ceilings, e.g., a dome-shaped ceiling. In some embodiments, an antenna (e.g., a second electrode) comprising at least one inductive coil element 112 is disposed above the ceiling 120 (two co-axial inductive coil elements 112 are shown). The inductive coil element 112 is coupled to a plasma power source 118 (e.g., a second RF power source) through a second matching network 119. The plasma power source 118 typically is capable of producing up to 3000 W at a tunable frequency in a range from 50 KHz to 13.56 MHz. The plasma power source 118 may be operable in a continuous wave (CW) or pulsed mode. When in pulse mode, the plasma power source 118 may be pulsed at a pulse frequency of up to about 100 KHz, or in some embodiments, between about 100 Hz to about 100 KHz. The plasma power source 118 may be operated at a duty cycle (e.g., the percentage of on time during the total of on time and off time in a given cycle) of between about 10% and about 90%. Alternatively, the power source 118 may be a microwave power source. In embodiments, where a microwave power source is utilized, the microwave power source may be used with or without a magnetic field.

Alternatively or in combination, the plasma power source 118 may be coupled to a second electrode (not shown), such as in or proximate the ceiling 120, in or proximate a showerhead (not shown), or the like, to capacitively couple the RF energy provided by the plasma power source 118 to the gases within the chamber 110 to form a plasma. Alternatively, the second electrode and second RF power source may be in a remote plasma configuration, for example, where the second electrode is disposed along or part of a conduit that partially provides a toroidal path for a plasma to travel along, and the second RF power source may be coupled to the conduit to form the plasma in the conduit. An exemplary reactor that may include a toroidal path include the plasma immersion ion implantation (P3I) process chambers, available from Applied Materials, Inc., of Santa Clara, Calif. Additional configurations of the second electrode and second RF power source are possible without departing from the scope of the present invention.

A controller 140 comprises a central processing unit (CPU) 144, a memory 142, and support circuits 146 for the CPU 144 and facilitates control of the components of the chamber 110 and, as such, of the etch process, as discussed below in further detail. To facilitate control of the process chamber 110, for example as described below, the controller 140 may be one of any form of general-purpose computer processor that can be used in an industrial setting for controlling various chambers and sub-processors. The memory 142, or computer-readable medium, of the CPU 144 may be one or more of readily available memory such as random access memory (RAM), read only memory (ROM), floppy disk, hard disk, or any other form of digital storage, local or remote. The support circuits 146 are coupled to the CPU 144 for supporting the processor in a conventional manner. These circuits include cache, power supplies, clock circuits, input/output circuitry and subsystems, and the like. The inventive methods described herein may be stored in the memory 142 as a software routine. The software routine may also be stored and/or executed by a second CPU (not shown) that is remotely located from the hardware being controlled by the CPU 144.

In operation, a substrate 114 is placed on the substrate support 116 and process gases are supplied from a gas panel 138 through entry ports 126 and form a gaseous mixture 150. The gaseous mixture 150 is ignited into the plasma 155 in the chamber 110 by applying power from the plasma power source 118 and biasing power source 122 to the inductive coil element 112 and the cathode 116, respectively. The pressure within the interior of the chamber 110 is controlled using a throttle valve 127 and a vacuum pump 136. Typically, the wall 130 is coupled to an electrical ground 134. The temperature of the wall 130 is controlled using liquid-containing conduits (not shown) that run through the wall 130.

The temperature of the substrate 114 may be controlled by stabilizing a temperature of the substrate support 116. In one embodiment, the helium gas from a gas source 148 is provided via a gas conduit 149 to channels (not shown) formed in the pedestal surface under the substrate 114. The helium gas is used to facilitate heat transfer between the substrate support 116 and the substrate 114. During processing, the substrate support 116 may be heated by a resistive heater (not shown) within the pedestal to a steady state temperature and then the helium gas facilitates uniform heating of the substrate 114. Using such thermal control, the substrate 114 may be maintained at a temperature of between about 0 to about 650 degrees Celsius.

Using the methods and apparatus disclosed herein, the ion energy distribution of the plasma may be controlled, for example while processing the substrate. For example, the present inventive methods may provide control over the ion flux existing at various energies during RF bias of the substrate to accelerate ions towards the wafer, for example, to achieve higher etching rates. The present inventive methods relate to using a combination of frequencies, one principle frequency and at least one of its harmonic frequencies, to tune the ion energy distribution and hence the flux content at various energies. When the substrate is biased using multiple RF sinusoidal frequencies, the effective voltage waveform at the wafer is a multi-peaked sinusoidal structure which alters the time-varying sheath potential. Since the total ion flux needs to be conserved, this introduces a multi-peaked structure to the ion energy distribution. The peaks of this IED will correspond to the maxima and minima of the instantaneous voltage drop as a function of time. The effective voltage waveform can be altered by varying the phase between the applied frequencies. Since the additional frequencies being applied is a higher harmonic frequency of the principle one, the phase difference can be used as a tuning knob to alter the maxima and minima of the applied voltage waveform. This in effect alters the time varying sheath structure thus shifting the peaks in the IED. Since the total ion flux needs to be conserved, a higher flux content at a given energy peak is provided at the expense of the ion flux at other energy levels.

Figure 3:
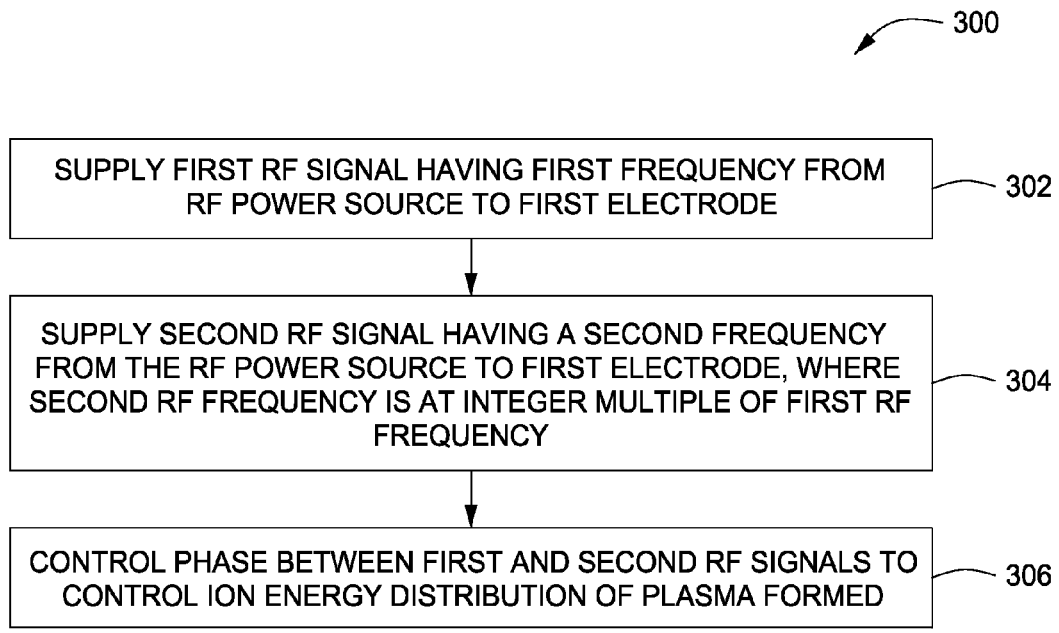
FIG. 3 depicts a flow chart for a method of controlling a plasma in a process chamber in accordance with some embodiments of the present invention.

For example, FIG. 3 depicts a method 300 for controlling a plasma in a process chamber in accordance with some embodiments of the present invention. The method 300 may be utilized with any of the embodiments of the system 100 discussed above and/or described in FIGS. 1 and 2A-B. Although described below with specific reference to the apparatus of FIG. 1, the inventive methods may be performed in any other suitable plasma enhanced substrate processing apparatus.

The method 300 (and/or the method 500 described below) may advantageously control the ion energy distribution to produce a maximum flux at a desired energy as discussed below without increasing total ion flux. This may differ from conventional methods where maximum flux at a desired energy is achieved by increasing RF signal amplitude which can increase total ion flux incident on a substrate. Further, conventional methods may achieve a desired range of energies or width of the IED by increasing the RF frequency. However, the RF wavelength at high frequencies may become comparable to the dimensions of features on the substrate which can result in process non-uniformities. A further advantage of the present inventive methods of controlling the ion energy distribution of the plasma is that the method utilizes a conventional sinusoidal waveform of the RF signal, as compared to more complicated measures such as trying to tailor the shape of the waveform (e.g., using non-sinusoidal waveforms) thereby avoiding the issues associated with passing high frequency components through the finite impedance of the substrate and chuck.

The method 300 generally begins at 302 by supplying a first RF signal having a first frequency from an RF power source to a first electrode 117 disposed beneath the substrate support surface 125 of the process chamber 110. The first RF signal may be supplied at a first amplitude. For example, prior to or at the same time as 302, the plasma 155 may be formed in the chamber 110 as discussed above. For example, a third RF signal may be provided from the second RF power source (e.g., the power source 118) to the second electrode (e.g., the antenna) to form the plasma 155 above the substrate support surface 125 in the process chamber 110. The first RF signal may be provided by any embodiment of the first RF power source discussed above, such as the biasing source 122 or the first RF generator 202.

At 304, a second RF signal having a second frequency is supplied from the RF power source to the first electrode 117. The second RF signal may be supplied at a second amplitude. In some embodiments, the second amplitude may be the same as the first amplitude. For example, the second RF signal can be a additional RF signal from the biasing source 122 or from the second RF generator 204 as discussed above. The second frequency may be at an integer multiple of the first frequency, for example, such as a harmonic frequency of the first frequency. For example, in some embodiments, the first frequency may be about 10 MHz and the second frequency may be about 20 MHz. However, the preceding embodiment is merely exemplary and any number of suitable frequencies may be used depending on the application, such as etching, deposition, or the identity of the substrate, such as etching or depositing materials in high aspect ratio or low aspect ratio features. In some embodiments, the first frequency may range from about 0.4 to about 60 MHz. In some embodiments, the second frequency may range from about 0.4 to about 60 MHz. However, first and second RF frequencies outside the specified ranges may be possible while still being applicable to the present invention.

Figure 4:
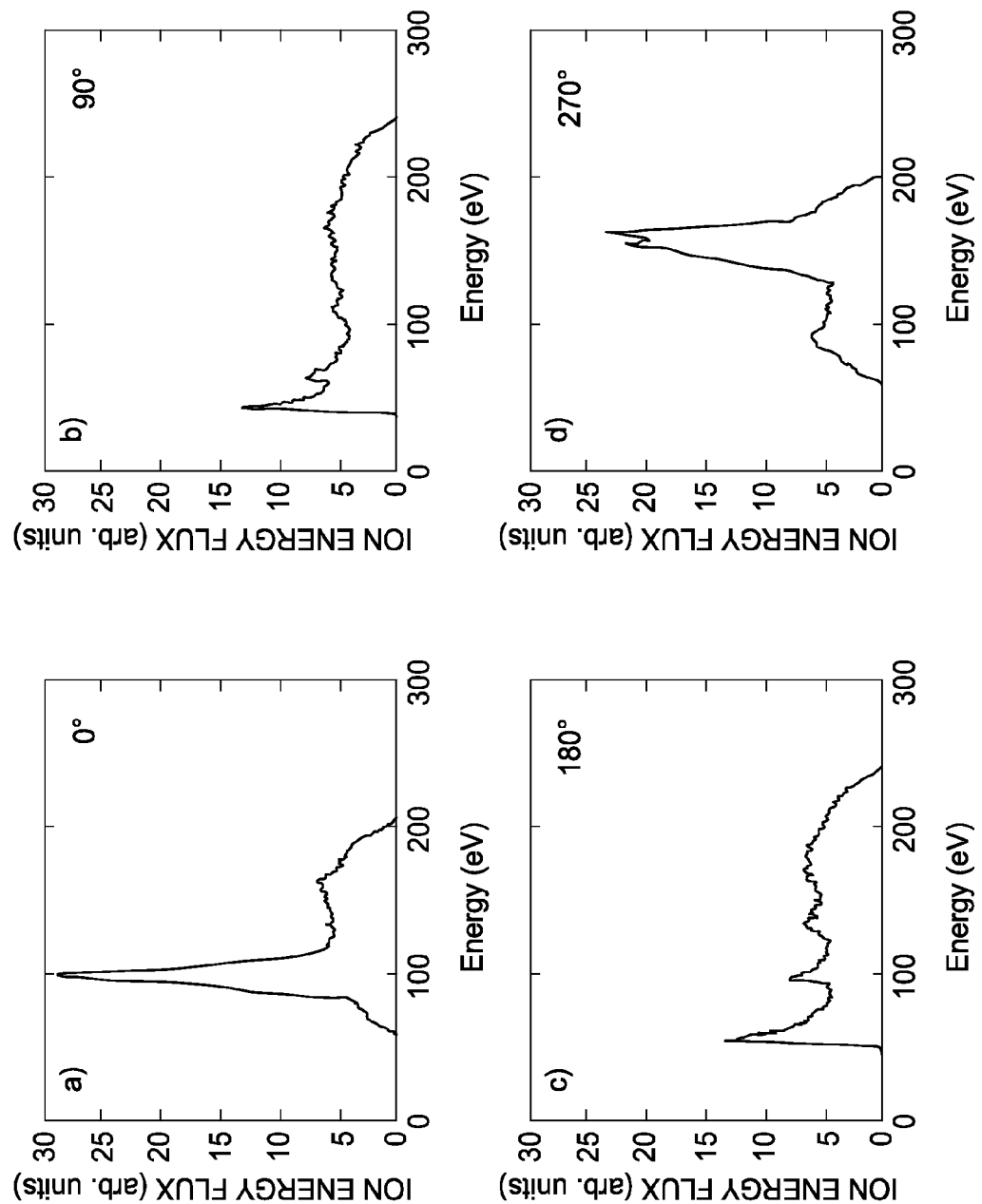
FIG. 4 depicts illustrative graphs labeled a)-d) of ion energy distributions at a plurality of phase differences between a first and a second RF signal applied to a first electrode disposed beneath a substrate supporting surface of a process chamber.

At 306, the phase between the first RF signal and the second RF signal may be controlled to control an ion energy distribution (IED) of a plasma, such as the plasma 155. For example, the phase maybe controlled by the phase controller 129 or by the controller 144 as discussed above. For example, FIG. 4 depicts the ion energy distribution (IED) over a range of phase differences between the first and second RF signals (in separate boxes respectively labeled, a), b), c), and d)). In each graph of FIG. 4, the x-axis is energy and the y-axis is ion flux (e.g., ion counts). For example, in the embodiments illustrated in FIG. 4, the phase difference increases from graph a) to graph d). In the embodiments illustrated in FIG. 4, the first and second RF signals are supplied at the same amplitude, the second frequency is a harmonic of the first frequency, and only the phase difference between the first and second RF signals are varied. Accordingly, under the set of conditions specified for FIG. 4, in each of graphs a)-d), the area of under each curve or the area of each IED is the same, or said another way—the total amount of ions or the total ion flux is conserved. The shapes and behavior illustrated in FIG. 4 are for a specific set of conditions and merely illustrative for the purposes of discussing the methods 300 and 500. The IED may also be controlled by providing different phase differences than illustrated in FIG. 4. In addition, the shapes and behavior of the IED may change depending on the frequencies and/or the relative amplitudes of the first and second RF signals.

Controlling the phase between the first and second RF signals can be used to control a range of ion energies in the ion energy distribution. For example, as illustrated in graph a) and graph b) of FIG. 4, adjusting the phase difference between the first and second RF signals may be used to increase the range of ion energies in the IED, the increase in the range being observed in graph b).

Alternatively or in combination, controlling the phase between the first and second RF signals can be used to control an amount of ions in the ion energy distribution to have a desired energy. For example, as illustrated in graph a) of FIG. 4, controlling the phase to a first phase difference between the first and second RF signals can produce a first amount of ions in the ion energy distribution have a first energy. For example, the first amount of ions in graph a) may be represented by a first peak of maximum ion flux and the first energy may be at a single energy or a range of energies spanning the peak of maximum ion flux. For example, by controlling the phase to a second phase difference different from the first phase difference, a second amount of ions in the ion energy distribution having a second energy different from the first energy may be produced as illustrated in graph d). For example, graph d) of FIG. 4 illustrates a second peak of maximum ion flux which may represent the second amount of ions. The second peak may be at a second energy or a range of second energies that are higher than the first energy or range of energies. For example, the second peak of maximum ion flux at a second energy higher than the first energy may, for example, be advantageous for etching a higher aspect ratio feature. For example, ions having the second energy may more frequently reach to etch at the bottom of deeper features than ions at the first energy.

For example, the first amount of ions may be reduced when the phase is changed from the first phase difference to the second phase difference. For example, as illustrated in graphs a) and d) of FIG. 4, and because the total flux is conserved, the first amount of ions represented by the first peak may be reduced at the expense of the second amount of ions represented by the second peak.

Figure 5:
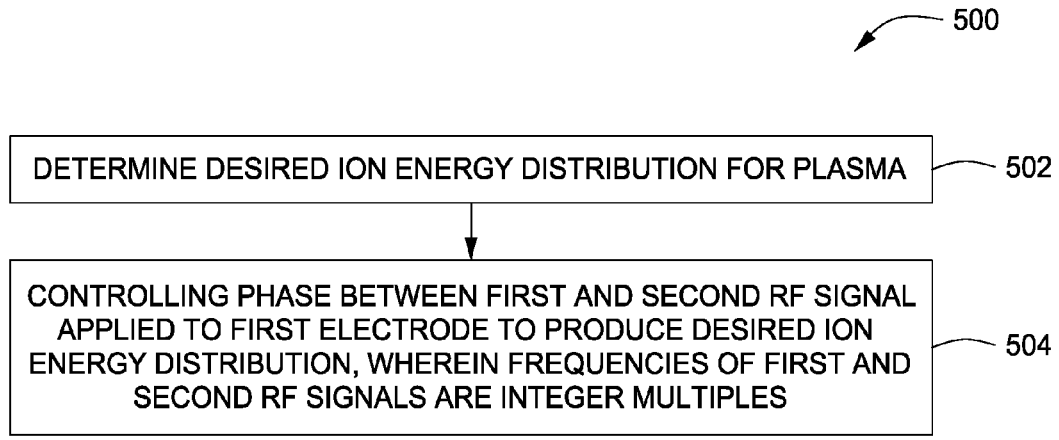
FIG. 5 depicts a flow chart for a method of controlling a plasma in a process chamber in accordance with some embodiments of the present invention.

FIG. 5 depicts a method 500 for controlling a plasma in accordance with some embodiments of the present invention. The method 500 generally begins at 502 by determining a desired ion energy distribution for a plasma, such as the plasma 150. For example, the desired ion energy distribution may be determined empirically or by modeling, such as modeling the plasma or the system 100 under any suitable process conditions, such as discussed above for the method 300. For example, the desired ion energy distribution may be determined for a specific type of substrate and/or process, such as etching a high aspect ratio feature, for example, such as a through silicon via (TSV) or the like, or etching or depositing specific types of materials, or the like. Once determined, the conditions for achieving the desired ion energy distribution may be stored, for example, on a computer-readable medium, such as the memory 142 of the controller 140, and recalled as required. For example, one empirical determination of the desired ion energy distribution may be obtained by performing one or more diagnostic experiments in the system 100, and measuring the ion energy distribution using any suitable measurement device, such as those measuring devices known in the art or any suitable device for measuring the ion energy distribution.

At 504, the phase between the first and second RF signal applied to the first electrode 117 can be controlled to produce the desired ion energy distribution. For example, any of the conditions discussed above regarding the method 300 may be applied at 504. For example, such as supplying the first RF signal at the first amplitude and first frequency and supplying the second RF signal at the second amplitude and second frequency. In some embodiments, the first amplitude may be the same as the second amplitude. In some embodiments, the first and second frequencies may be integer multiples. In some embodiments, the phase can be tuned to control an amount of ions in the ion energy distribution to have a desired energy or range of energies.

Figure 6:
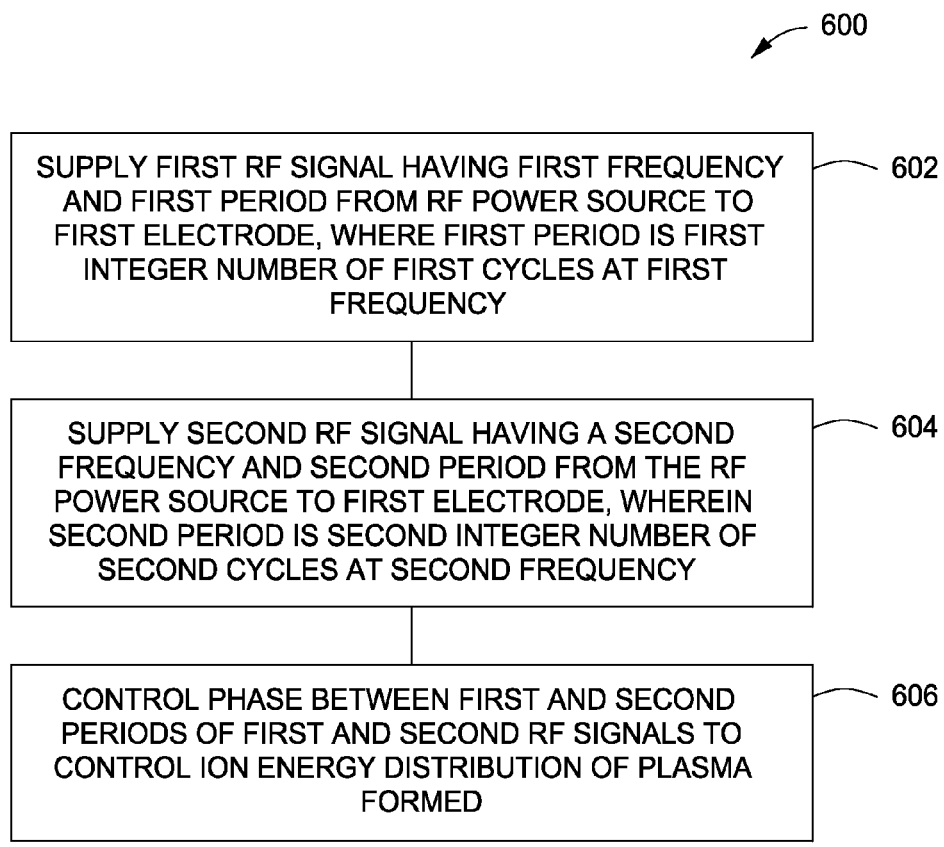
FIG. 6 depicts a flow chart for a method of controlling a plasma in a process chamber in accordance with some embodiments of the present invention.

More generalized forms of the methods 300 and 500 are discussed below and depicted by flow charts in FIGS. 6 and 7, respectively. For example, FIG. 6 depicts a method 600 for controlling a plasma in a process chamber in accordance with some embodiments of the present invention. The method 600 may be utilized with any of the embodiments of the system 100 discussed above and/or described in FIGS. 1 and 2A-B. Although described below with specific reference to the apparatus of FIG. 1, the inventive methods may be performed in any other suitable plasma enhanced substrate processing apparatus. The method 600 (and/or the method 700 described below) may provide similar advantages as discussed above for methods 300 and 500, respectively.

The method 600 generally begins at 602 by supplying a first RF signal having a first frequency and a first period from an RF power source to a first electrode 117 disposed beneath the substrate support surface 125 of the process chamber 110. The first RF signal may be supplied at a first amplitude. For example, prior to or at the same time as 602, the plasma 155 may be formed in the chamber 110 as discussed above. For example, a third RF signal may be provided from the second RF power source (e.g., the power source 118) to the second electrode (e.g., the antenna) to form the plasma 155 above the substrate support surface 125 in the process chamber 110. The first RF signal may be provided by any embodiment of the first RF power source discussed above, such as the biasing source 122 or the first RF generator 202.

The first period of the first RF signal may be equal to a first integer number of first cycles at the first frequency. For example, the first frequency of 15 MHz has the first cycle of $1/(15\times10^6)$ seconds, wherein the first cycle is the period of a single repeat unit at the first frequency. The first period of the first RF signal is equal to the first integer number of first cycles at the first frequency, wherein the first period can be considered as the period of a single repeat unit of the first RF signal.

At 604, a second RF signal having a second frequency and second period is supplied from the RF power source to the first electrode 117. The second RF signal may be supplied at a second amplitude. In some embodiments, the second amplitude may be the same as the first amplitude. For example, the second RF signal can be an additional RF signal from the biasing source 122 or from the second RF generator 204 as discussed above. The second frequency may be at an integer multiple of the first frequency, for example, such as a harmonic frequency of the first frequency. The first and second frequency may have substantially similar ranges as discussed above, e.g., about 0.4 to about 60 MHz, or other frequencies beyond the upper and lower limits of those ranges.

The second period of the second RF signal may be equal to a second integer number of second cycles at the second frequency. For example, the second frequency of 25 MHz has the first cycle of $1/(25\times10^6)$ seconds, wherein the second cycle is the period of a single repeat unit at the second frequency. The second period of the second RF signal is equal to the second integer number of second cycles at the second frequency, wherein the second period can be considered as the period of a single repeat unit of the second RF signal.

In some embodiments, the relationship between the first and second RF signals may be such that a first multiplicative product of the first frequency and the first integer number of first cycles may be equal to a second multiplicative product of the second frequency and the second integer number of second cycles. In the exemplary embodiments described above for a first frequency of 15 MHz and a second frequency of 25 MHz, the first integer number may be 5 and the second integer number may be 3, such that the first and second multiplicative products both equal 75.

At 606, the phase between the first and second periods of the first RF signal and the second RF signal may be controlled to control an ion energy distribution (IED) of a plasma, such as the plasma 155. For example, the phase maybe controlled by the phase controller 129 or by the controller 144 as discussed above to achieve similar results as depicted in FIG. 4 and discussed above.

Figure 7:
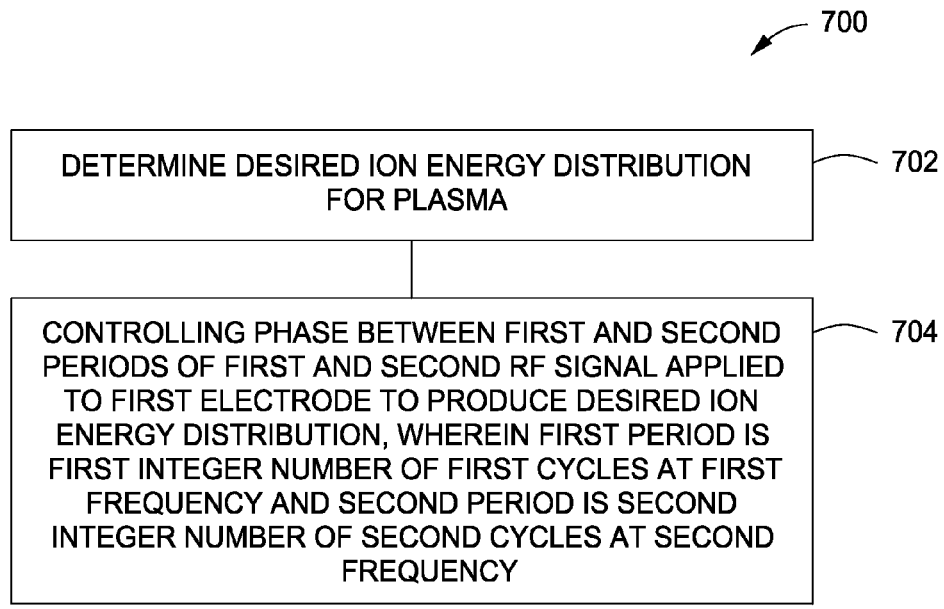
FIG. 7 depicts a flow chart for a method of controlling a plasma in a process chamber in accordance with some embodiments of the present invention.

FIG. 7 depicts a method 700 for controlling a plasma in accordance with some embodiments of the present invention.

For example, the method 700 may be a generalized form of the method 500. The method 700 generally begins at 702 by determining a desired ion energy distribution for a plasma, such as the plasma 150 in a substantially similar manner to that discussed above at step 502 of method 500.

At 704, the phase between the first and second periods of the first and second RF signal applied to the first electrode 117 can be controlled to produce the desired ion energy distribution. For example, any of the conditions discussed above regarding the method 600 may be applied at 704. For example, such as supplying the first RF signal at the first amplitude and first frequency and supplying the second RF signal at the second amplitude and second frequency, wherein the first period is a first integer number of first cycles at the first frequency and the second period is a second integer number of second cycles at the second frequency and wherein a first multiplicative product of the first frequency and the first integer number is equal to a second multiplicative product of the second frequency and the second integer number. In some embodiments, the first amplitude may be the same as the second amplitude. In some embodiments, the first and second frequencies may be integer multiples. In some embodiments, the phase between the first and second periods can be tuned to control an amount of ions in the ion energy distribution to have a desired energy or range of energies.

The methods and apparatus disclosed herein may be utilized in any number of processing applications. For example, as discussed above, the inventive methods may be used in etching processes, such as for high aspect ratio features, TSV applications, or the like. Further, the inventive methods may be utilized for selective etch processes for example, including both etching and deposition steps. For example, the inventive methods may be utilized to control ion energy distribution during a deposition process, an etching process, an oxidation process, a nitridation process, or the like.

Further, additional embodiments of the inventive methods may be possible. For example, such as utilizing any suitable number of frequencies to control the ion energy distribution. For example, such as using one fundamental frequency and several harmonic frequencies and controlling the respective phase differences between each frequency to achieve the desired ion energy distribution. Further, the amplitudes between each RF signal need not be the same as discussed for the embodiments of FIG. 4 above. For example, the frequencies may be set at any suitable amplitude to produce the desired ion energy distribution.

While the foregoing is directed to embodiments of the present invention, other and further embodiments of the invention may be devised without departing from the basic scope thereof.

The invention claimed is:

1. A method of controlling a plasma in a process chamber, comprising:
supplying a first RF signal having a first frequency and a first period from an RF power source to a first electrode disposed beneath a substrate support surface in the process chamber, wherein the first period is equal to a first integer number of first cycles at the first frequency;
supplying a second RF signal having a second frequency and a second period from the RF power source to the first electrode, wherein the second period is equal to a second integer number of second cycles at the second frequency and wherein a first multiplicative product of the first frequency and the first integer number is equal to a second multiplicative product of the second frequency and the second integer number; and
controlling the phase between the first and second periods of the first and second RF signals to control an ion energy distribution of a plasma formed in the process chamber.

2. The method of claim 1, wherein controlling the phase further comprises:
controlling the phase between the first and second periods of the first and second RF signals to control a range of ion energies in the ion energy distribution.

3. The method of claim 1, wherein controlling the phase further comprises:
controlling the phase between the first and second periods of the first and second RF signals to control an amount of ions in the ion energy distribution to have a desired energy.

4. The method of claim 2, wherein a total amount of ions in the ion energy distribution is conserved.

5. The method of claim 4, wherein controlling the phase further comprises:
controlling the phase to a first phase difference between the first and second periods of the first and second RF signals to produce a first amount of ions in the ion energy distribution having a first energy.

6. The method of claim 5, wherein controlling the phase further comprises:
controlling the phase to a second phase difference different from the first phase difference to produce a second amount of ions in the ion energy distribution having a second energy different from the first energy.

7. The method of claim 6, wherein the first amount of ions is reduced when the phase is changed from the first phase difference to the second phase difference.

8. The method of claim 1, wherein the first RF signal is supplied at a first amplitude and the second RF signal is supplied at a second amplitude that is the same as the first amplitude.

9. The method of claim 1, further comprising:
supplying a third RF signal from a second RF power source to a second electrode disposed above the substrate support surface to form the plasma above the substrate support surface in the process chamber.

10. The method of claim 1, wherein the second frequency is an integer multiple of the first frequency.

11. A method of controlling characteristics of a plasma in a process chamber using an RF power source, comprising:
determining a desired ion energy distribution for the plasma; and
controlling the phase between a first period of a first RF signal and a second period of a second RF signal applied to a first electrode disposed beneath a substrate support surface in the process chamber to produce the desired ion energy distribution, wherein the first RF signal has a first frequency and the first period is equal to a first integer number of first cycles at the first frequency and wherein the second RF signal has a second frequency and the second period is equal to a second integer number of second cycles at the second frequency, and
wherein a first multiplicative product of the first frequency and the first integer number is equal to a second multiplicative product of the second frequency and the second integer number.

12. The method of claim 11, wherein the first and second frequencies are integer multiples.

13. The method of claim 11, further comprising:
supplying the first RF signal at a first amplitude; and supplying the second RF signal at a second amplitude, wherein the second frequency is a harmonic frequency of the first frequency.

14. The method of claim 13, wherein the first amplitude of the first RF signal is equal to the second amplitude of the second RF signal.

15. The method of claim 14, wherein tuning the phase further comprises:
tuning the phase between the first and second periods of the first and second RF signals to control an amount of ions in the ion energy distribution to have a desired ion energy.

16. An apparatus for processing a substrate, comprising:
a process chamber having a substrate support disposed in a processing volume of the process chamber;
a first electrode disposed beneath a substrate support surface of the substrate support;
a first RF power source coupled to the first electrode to provide a first RF signal having a first frequency and a first period and a second RF signal having a second frequency and a second period to the first electrode, wherein the first period is equal to a first integer number of first cycles at the first frequency, wherein the second period is equal to a second integer number of second cycles at the second frequency, and wherein a first multiplicative product of the first frequency and the first integer number is equal to a second multiplicative product of the second frequency and the second integer number; and
a phase controller to control the phase between the first and second periods of the first and second RF signals to control an ion energy distribution of a plasma formed in the process chamber.

17. The apparatus of claim 16, further comprising:
a second electrode disposed above the substrate support to form the plasma in the processing volume; and
a second RF power source coupled to the second electrode.

18. The apparatus of claim 16, wherein the phase controller is configured to tune the phase between the first and second periods of the first and second RF signals to produce an amount of ions in the ion energy distribution of the plasma to a desired energy.

19. The apparatus of claim 16, wherein the phase controller is configured to tune the phase between the first and second periods of the first and second RF signals to control a range of ion energies in the ion energy distribution of the plasma.

20. The apparatus of claim 16, further comprising:
a frequency multiplier coupled to the first RF power source to control the frequency of an RF signal produced by the first RF power source.

* * * * *